United States Patent [19]

Leong

[11] Patent Number: 5,192,697
[45] Date of Patent: Mar. 9, 1993

[54] SOG CURING BY ION IMPLANTATION

[75] Inventor: Joe H. K. Leong, Lodge, Singapore

[73] Assignee: Chartered Semiconductor Manufacturing PTE Ltd., Singapore, Singapore

[21] Appl. No.: 826,115

[22] Filed: Jan. 27, 1992

[51] Int. Cl.[5] .......................................... H01L 21/265
[52] U.S. Cl. ....................................... 437/37; 437/231; 437/240
[58] Field of Search .................................. 437/231, 37

[56] References Cited

U.S. PATENT DOCUMENTS 4,983,546  1/1991  Hyun et al. ........................... 437/231
5,003,062  3/1991  Yen ....................................... 437/228

FOREIGN PATENT DOCUMENTS 1-244658   9/1989  Japan.
2-235358   9/1990  Japan.
2-240948   9/1990  Japan.
2-302038  12/1990  Japan.

Primary Examiner—Olik Chaudhuri
Assistant Examiner—Long Pham
Attorney, Agent, or Firm—George O. Saile

[57] ABSTRACT

Ion Implantation is used to cure spin-on-glass layers. Ions, such as Argon or Arsenic are implanted into the spin-on-glass layer of an article. The action of the ion moving through the spin-on-glass layer causes internal heating. This heating cures the spin-on-glass layer of the article.

23 Claims, 2 Drawing Sheets

SOG CURING BY ION IMPLANTATION

BACKGROUND OF THE INVENTION (1) Field of the Invention

The invention relates to a method of curing a spin-on-glass (SOG) planarization layer for an integrated circuit device, and more particularly, to a method of curing a spin-on-glass (SOG) planarization layer of an integrated circuit via ion implantation.

(2) Description of the Prior Art

The spin-on-glass materials and how they are processed may be critical to the success of the process for planarization of integrated circuits. The most useful materials are silicates—$Si(OH)_4$ and siloxanes—$(RO)_n$-$Si(OH)_{4-n}$. These types of materials are generally known and available. Examples of the silicate type is OCD Type 2 made by Tokyo Okha Corp. and siloxane type is OCD Type 6 made by Tokyo Okha Corp. Each spin-on-glass coating is less than about 0.3 micrometers and preferably between about 0.08 and 0.2 micrometers. The more coatings that are used, the better the planarity. The material to be applied is thoroughly mixed in a suitable solvent which is usually a combination of a high boiling point solvent and a low boiling point solvent.

The preferred low boiling point solvents are methanol, ethanol, and propanol. The middle boiling point solvents are buthanol, penthanol, hexanol and methyl cellosolve. The high boiling point solvents are butyl cellosolve, propylene glycol, diethylene glycol and Carbindol. Other potential vehicles or solvents are NMP, HMPA, N.N-dimethylacetoamide, acetyl acetone, and malonic acid diethylester and the like.

The spin-on-glass material suspended in the vehicle or solvent is deposited onto the semiconductor wafer surface and uniformly spread thereover by the action of spinning the wafer. The material fills the indentations in the integrated circuit wafer surface, that is planarization. Most of the vehicle or solvent is driven off by a low temperature baking step. At this point, the critical vacuum degassing step is accomplished by subjecting the wafer to a vacuum of less than about 100 mtorr and 350 degrees C. This last step removes chemical materials which could during latter processing cause cracking and corrosion of the next level conductor material. Other coatings of the spin-on-glass material are applied, baked and vacuum degassed until the desired spin-on-glass layer is formed.

The final step in the making of the spin-on-glass layer is curing. Curing is a high temperature heating step to cause the breakdown of the silicate or siloxane material to a silicon dioxide like cross linked material. U.S. Pat. No. 4,983,546 filed on Dec. 20, 1989 by Il S. Hyun et al describes a method of applying an ultraviolet light source within a heating chamber to cure the spin-on-glass layer.

The conventional curing methods for spin-on-glass present problems. Gases trapped within the spin-on-glass after curing integrated circuit can cause corrosion of the metal conductors in time. Additionally, the etch rate of furnace-cured spin-on-glass is poor compared to the etch rate of thermally grown oxide.

SUMMARY OF THE INVENTION

A principal object of the present invention is to provide an effective and very manufacturable method of curing the spin-on-glass layer of an article.

Another object of the present invention is to provide a method of curing the spin-on-glass layer of an article which results in similar or better dielectric strength than a temperature cure method.

Another object of the present invention is to provide a method of curing the spin-on-glass layer of an article which results in a reduction of trapped gases.

Another object of the present invention is to provide a method of curing the spin-on-glass layer of an article which results in a reduction of hillock growth of underlying Aluminum layers.

In accordance with the objects of this invention a new method of curing the spin-on-glass layer of an article is achieved. Ions, such as Argon or Arsenic are implanted into the spin-on-glass layer of an article. The action of the ions moving through the spin-on-glass layer causes heating. This heating cures the spin-on-glass layer of the article.

BRIEF DESCRIPTION OF THE DRAWINGS

In the accompanying drawings forming a material part of this description, there is shown.

DESCRIPTION OF THE PREFERRED EMBODIMENTS

Figure 1:
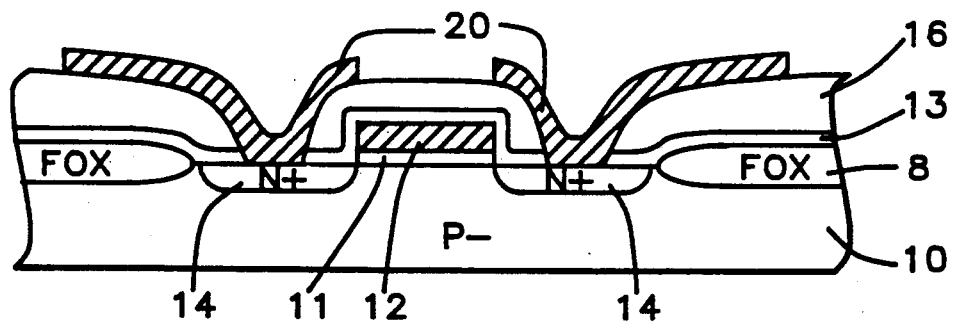
FIGS. 1 through 3 schematically illustrate in cross-sectional representation one preferred embodiment of this invention.

Referring now more particularly to FIG. 1, there is shown an illustration of a partially completed, single N channel metal oxide field effect transistor (MOSFET). The first series of steps involve the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field Oxide pattern, FOX 8. Then semiconductor devices can be provided in the silicon mesas according to the following processes.

The surface of the silicon substrate 10 is thermally oxidized to form the desired gate oxide 11 thickness. The preferred thickness is between about 70 to 200 Angstroms. The polysilicon layer 12 is blanket deposited by LPCVD (Low Pressure Chemical Vapor Deposition) method to a conventional thickness. The polysilicon layer 12 is ion implanted with phosphorous or arsenic ions by conventional methods and dosages to render the polysilicon layer conductive or doped with phosphorus oxychloride at a temperature about 900° C. The surface of the layer is either thermally oxidized or a chemical vapor deposition process to form silicon oxide layer 13. The layers 11, 12 and 13 are patterned by conventional lithography and anisotropic etching techniques as are conventional in the art to provide a desired pattern of gate electrodes and structure on the FOX 8 surfaces or elsewhere as seen in FIG. 1.

The source/drain structure of the MOS FET may now be formed by conventional methods. FIG. 1 shows an N channel MOSFET integrated circuit device wherein the substrate or well is doped as P−. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate.

FIG. 1, for example shows the device regions, typically source/drain regions 14 in the substrate as of N+ dopants. The N+ regions may be formed by ion implantation as is well known in the art.

A passivation or insulating layer 16 is now formed over the surfaces of the patterns. This layer may be composed of multilayers such as a thin layer of silicon oxide and a much thicker layer of borophosphosilicate glass, phosphosilicate glass or similar insulating layer. The operational thicknesses of these layers are between about 1000 to 2000 Angstroms for the oxide layer and between about 5000 to 6000 or more Angstroms for the glasseous layer. These layers are typically deposited by chemical vapor deposition in low pressure or atmospheric pressure, or in a plasma enhanced reactive chamber.

The contact windows are openings are formed through the insulating structure to the source/drain regions 14. Conventional lithography and etching techniques are used to form this pattern of openings.

The first metallurgy contact layer 20 is now deposited over the surface of the structure and within the pattern of contact openings. The metallurgy is preferably Al/0.8% Si/0.5% Cu having a thickness of between about 5500 to 6500 Angstroms. However, other possible metallurgy include Aluminum-Silicon, dual-doped polysilicon, Titanium Silicide, Titanium:Tungsten, Titanium Nitride and Chemical Vapor Deposition Tungsten and polycides. The metallurgy may be deposited by dc magnetron sputtering. The metallurgy is now patterned into the desired conductive lines by conventional lithography and etching techniques to form the pattern of metal layer 20 in FIG. 1.

Figure 2:
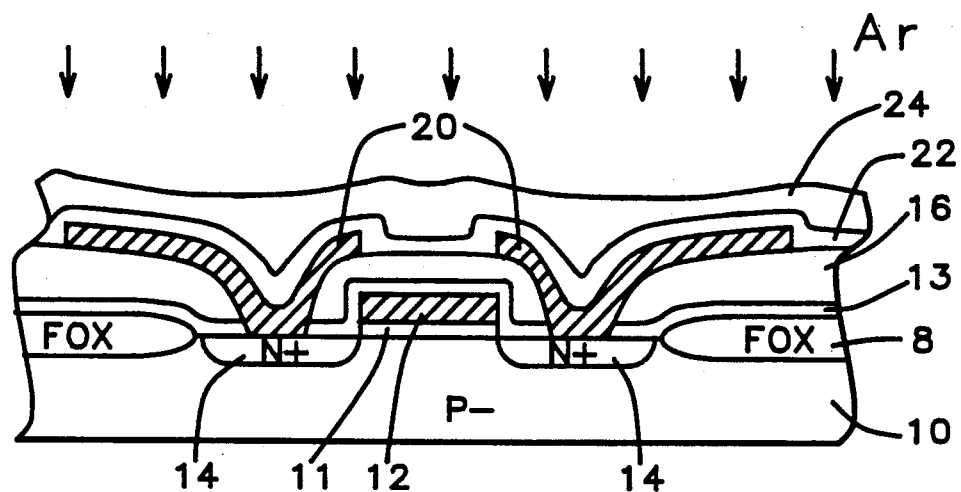

Referring now more particularly to FIG. 2, the usual first dielectric silicon oxide layer 22 of the spin-on-glass sandwich planarization structure is now formed above the first metallurgy pattern 20. It is typically in the range of between about 3000 to 4000 Angstroms in thickness. This is followed by the creation of the spin-on-glass layer 24. The spin-on-glass material suspended in the vehicle or solvent is deposited onto the semiconductor wafer surface and uniformly spread thereover by the action of spinning the wafer. The material fills the indentations in the integrated circuit wafer surface, that is planarization. Most of the vehicle or solvent is driven off by a low temperature baking step. Typically, three hot plates are arranged sequentially with temperature setpoints at 100° C., 175° C., and 250° C. Duration is one minute per plate. Typically, a double coat of the spin-on-glass material is applied. The material can be either silicate or siloxane. Each coat is 1000 to 1200 Angstroms thick for a total thickness of 2000 to 2400 Angstroms.

After the spin-on-glass (SOG) layer has been completed, the layer 24 is cured by the ion implantation method of this invention. The Ion implantation is done within a vacuum chamber. The wafer or wafers are set upon a pedestal within the vacuum chamber. A cooling fluid, such as water, is circulated through the pedestal to maintain the wafer temperature at between about 90° to 100° C. The chamber is brought to a vacuum of less than about $2 \times 10^{-5}$ Torr. Ions, preferably Argon are implanted into the spin-on-glass layer 24 at a preferred dose of between $5E+15$ and $1E+16$ ions/cm$^2$ and energy of 80 to 120 KeV for a thickness of about 2000 Angstroms of silicate type material, such as 2P-48340 made by Tokyo Okha Corp. The preferred implant time is about 10 minutes under these conditions. Since the implantation is done within a vacuum chamber, the gases trapped within the wafer are pulled out by the vacuum. The action of the Argon ions moving through the spin-on-glass layer causes heating which causes curing of the spin-on-glass layer.

Figure 3:
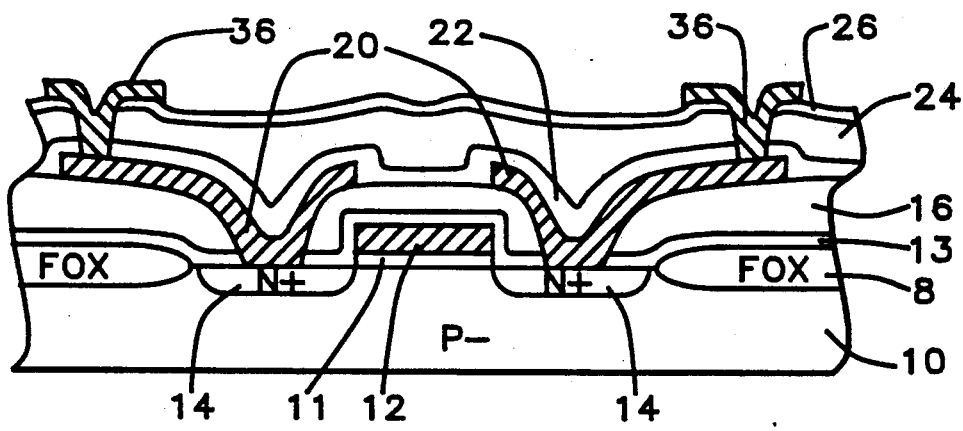

FIG. 3 illustrates the deposition of a second layer of silicon dioxide 30. Openings are made through the spin-on-glass sandwich 22, 24, 30 using conventional lithography and etching techniques. Contact is made to the first metal layer 20 by a second metal layer 36 which is deposited into the opening. The metal layer 36 is patterned by conventional lithography and etching techniques to complete construction of the desired FET structure shown in this FIG. 3. It is of course understood by those skilled in the art that further layers of spin-on-glass sandwich can be formed to allow further metallurgy to be applied over the structure.

The volume shrinkage caused by Argon implantation can be controlled by varying the energy of the implantation. The dose of the ions do not affect shrinkage of the SOG layer. Examples of energy variation to control shrinkage to a reasonable amount are 40 to 140 KeV. Increasing the energy and dose of the implant during curing has been found to give higher breakdown voltages. This means that the SOG can sustain greater electric fields and fulfills the criterion of a dielectric material whose primary function is to provide isolation between layers.

Hillock growth on the underlying Aluminum layer is minimized with the implant cure because of the much lower operating temperature as compared with the operating temperature of the furnace cure process. Reduces the hillock growth in turn reduces the stress between films.

Figure 4:
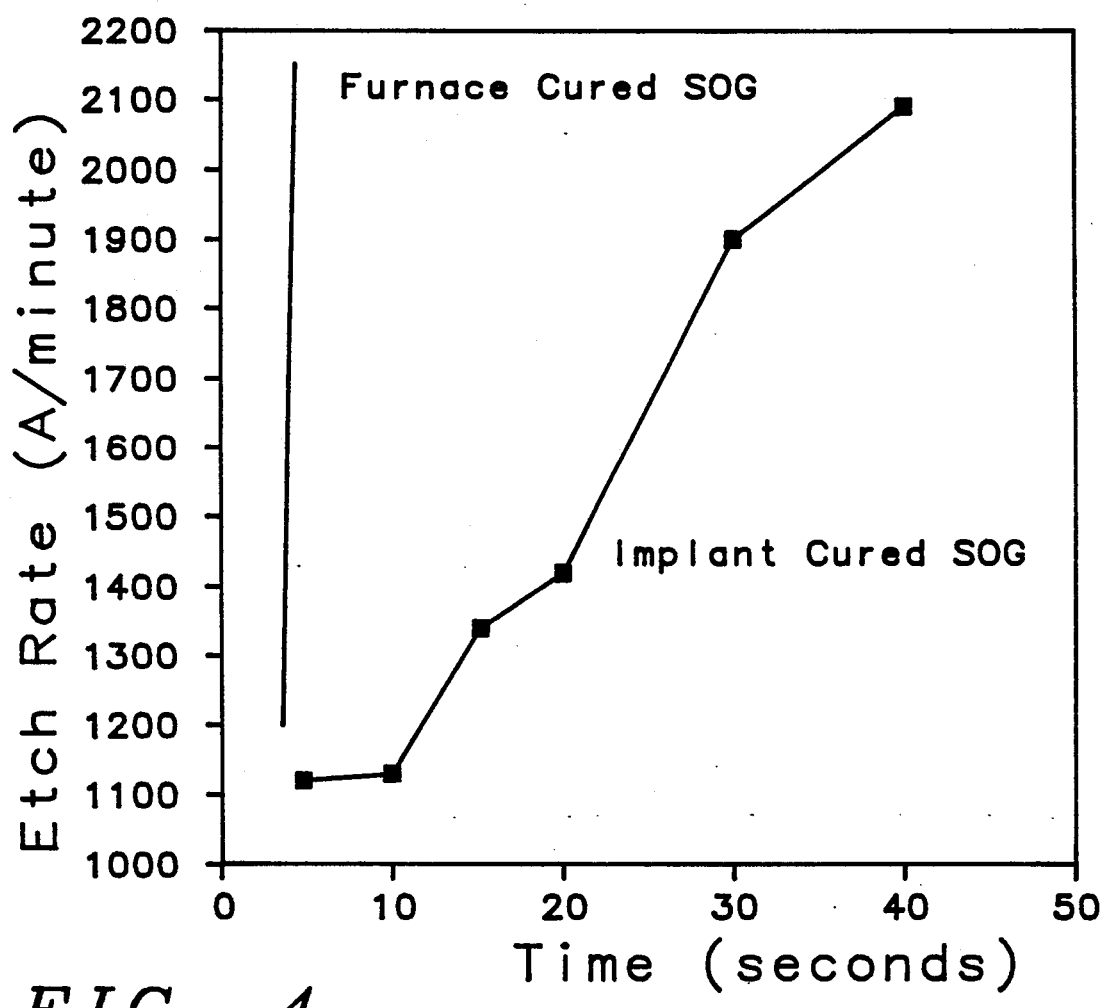
FIG. 4 graphically illustrates a comparison between the etch rates of implant-cured spin-on-glass and furnace-cured spin-on-glass in 50:1 Water: Hydrofluoric acid (HF).

Referring now to FIG. 4, the etch rate of the Argon ion implanted cured SOG layer is compared to the Furnace cured SOG at a temperature of 400° C. The furnace cured SOG etches in 50:1 water:HF extremely fast, while the Argon ion implantation cured SOG etches much slower as seen by the graph. Thermally formed silicon oxide etches at about 50 Angstroms/minute in 50:1 water:HF which is much slower than the SOG cured material.

The following Examples are given to show the important features of the invention and to aid in the understanding thereof and variations may be made by one skilled in the art without departing from the spirit and scope of the invention.

EXAMPLES

The Examples in the Tables 1 and 2 were formed on silicon wafers. Spin-on-glass material composed of silicate material OCD Type -2 P-48340-SG manufactured by Tokyo Ohka Kogyo Co, Ltd. (1-403 Kosugi-cho, Nakahara-ku, Kawasaki, 211 Japan, Tel: 044-711-3114, TLX: 3842496 OHKA J., Fax: 044-733-0398) was deposited upon the bare silicon wafers to a thickness of about 2100 Angstroms. The SOG was baked at 100°-250° C. for 1-10 minutes in air to drive off the solvent. Argon ions in the dose/energy indicated in Table 1 for each EXAMPLE 1-9 were implanted to cure the SOG layer. Arsenic ions in the dose/energy indicated in Table 2 for each EXAMPLE a-f were implanted to cure the SOG layer. The test wafers were sputtered with aluminum dots measuring 1 to 1.5 mm in diameter using a CVP sputterer. A voltage ramp was applied using the HP4145B with the aluminum dot as one electrode (+) and the substrate as the other electrode of the capacitor structure with the SOG as the dielectric. The voltage at which the leakage current exceeds 1 microampere is recorded as the breakdown voltage. Shrinkage is calculated as the initial thickness minus the final thickness of the SOG divided by the initial thickness, the result multiplied by 100%.

TABLE 1

Argon

| EXP. | ENERGY (kev) | DOSE (IONS/CM$^2$) | SHRINKAGE (%) | BREAKDOWN VOLTAGE (v) |
|---|---|---|---|---|
| 1 | 80 | 1E15 | 18 | 14.8-19.6 |
| 2 | 80 | 5E15 | 18.1 | 41.6-55.5 |
| 3 | 80 | 1E16 | 17 | 49.1-61.5 |
| 4 | 120 | 1E15 | 6 | 24.8-31.7 |
| 5 | 40 | 1E15 | 11 | 7.4-9.5 |
| 6 | 60 | 2E15 | 16.5 | 8.-17.5 |
| 7 | 100 | 2E15 | 6.6 | 28.-35. |
| 8 | 120 | 2E15 | 9.9 | 31.-39. |
| 9 | 140 | 2E15 | 12.8 | 32.-41. |

TABLE 2

Arsenic

| EXP. | ENERGY (kev) | DOSE (IONS/CM$^2$) | SHRINKAGE (%) | BREAKDOWN VOLTAGE (v) |
|---|---|---|---|---|
| a | 80 | 1E15 | 14.6-14.8 | 9-25 |
| b | 80 | 5E15 | 18.0-18.2 | no breakdown |
| c | 80 | 1E16 | 18.5-18.7 | no breakdown |
| d | 160 | 1E15 | 5.1-5.9 | 42-49 |
| e | 160 | 5E15 | 14.2-14.4 | no breakdown |
| f | 160 | 1E16 | 16.6-17.0 | no breakdown |

Note: no breakdown - ramp stops are 100 V (compliance)

The results of the experiments show that the dielectric strength of the SOG increases with increasing dose and with increasing energy. The breakdown voltage for furnace-cured SOG occupies a wide range from 2 to 30 volts. To achieve dielectric strength that is comparable to that for furnace-cured SOG, the dose of Argon ions can be between 2E15 to 1E16 ions/cm$^2$ and the energy is preferably between 80 and 140 KeV for a film thickness of 2100 Angstroms. In all Arsenic EXAMPLES except EXAMPLE a, a dielectric strength comparable to furnace-cured SOG is achieved. In a separate experiment using actual product wafers, the arsenic implant cure at a dose of 5E15 ions/cm$^2$ and energy of 80 KeV, the wafer yield was comparable to the standard furnace cure process.

While the invention has been particularly shown and described with reference to the preferred embodiments thereof, it will be understood by those skilled in the art that various changes in form and details may be made without departing from the spirit and scope of the invention.

What is claimed is:

1. The method of curing the spin-on-glass layer of an integrated circuit comprising:
   ion implantation of ions into said spin-on-glass layer of an integrated circuit;
   the said ions are applied in sufficient dosage and energy to cause heating within the spin-on-glass layer during their movement through the spin-on-glass layer; and
   said heating cures the said spin-on-glass layer of the integrated circuit.

2. The method of claim 1 wherein said ions are Argon and without using an external heat source.

3. The method of claim 2 wherein the dose of said ion implant is between 5E15 and 1E16 ions/cm$^2$.

4. The method of claim 2 wherein the energy of said ion implant is between 80 and 120 KeV.

5. The method of claim 1 wherein said ions are Arsenic and without using an external heat source.

6. The method of claim 5 wherein the dose of said ion implant is between 1E15 and 1E16 ions/cm$^2$.

7. The method of claim 5 wherein the energy of said ion implant is between 80 and 160 KeV.

8. The method of claim 1 wherein said ion implantation is done within a vacuum chamber resulting in the improved release of trapped gasses from the spin-on-glass layer during said ion implantation.

9. The method of curing the spin-on-glass layer of an integrated circuit comprising:
   ion implantation of Argon into said spin-on-glass layer of an integrated circuit;
   the action of said Argon ions moving through the spin-on-glass layer causes heating; and
   said heating cures the said spin-on-glass layer of the integrated circuit.

10. The method of claim 9 wherein the dose of said Argon ion implant is between 5E15 and 1E16 ions/cm$^2$.

11. The method of claim 9 wherein the energy of said Argon ion implant is between 80 and 120 KeV.

12. The method of claim 9 wherein the thickness of said Argon ion implantation is between about 2000 to 2400 Angstroms.

13. The method of claim 9 wherein said spin-on-glass layer is composed at least in part of silicate material.

14. The method of claim 9 wherein said spin-on-glass layer is composed at least in part of siloxane material.

15. The method of claim 9 wherein said Argon implantation is done within a vacuum chamber resulting in the improved release of trapped gasses from the spin-on-glass layer during said ion implantation.

16. The method of curing the spin-on-glass layer of a planarized MOSFET multilayered metal structure comprising:
   providing a MOSFET semiconductor structure in and on a semiconductor substrate;
   providing conductive layers for contacting the active elements of said MOSFET structure;
   providing a layer of an insulator over said conductive layers and a spin-on-glass layer over said layer of an insulator;
   ion implantation of ions into said spin-on-glass layer of an integrated circuit;
   the said ions are of sufficient dosage and energy that the action of said ions moving through the spin-on-glass layer causes heating;

said heating in turn causes the curing of said spin-on-glass layer of the integrated circuit;

forming a insulator layer over said cured spin-on-glass layer;

forming openings through said insulator layers and said cured spin-on-glass layer to said conductive layer; and depositing a second conductive layer into said openings to make contact to said conductive layer to complete said planarized MOSFET multilayer metal structure.

17. The method of claim 16 wherein said ions are Argon and without using an external heat source, and the dose of said Argon ion implant is between about 5E15 and 1E16 ions/cm$^2$.

18. The method of claim 16 wherein said ions are Argon and the energy of said Argon ion implant is between 80 and 120 KeV.

19. The method of claim 16 wherein said ions are Arsenic and without using an external heat source, and the dose of said Argon ion implant is between about 1E15 and 1E16 ions/cm$^2$.

20. The method of claim 16 wherein said ions are Arsenic and the energy of said Argon ion implant is between 80 and 160 KeV.

21. The method of claim 16 wherein the thickness of each said spin-on-glass layer is between about 1000 to 1200 Angstroms.

22. The method of claim 16 wherein said ion implantation is done within a vacuum chamber resulting in the improved release of trapped gasses from the spin-on-glass layer during said curing.

23. The method of claim 16 wherein the said spin-on-glass layer is composed at least in part of a silicate material.

* * * * *